United States Patent [19]  [11]  4,406,245
Heinen  [45]  Sep. 27, 1983

[54] DEVICE FOR EPITAXIAL DEPOSITING LAYERS FROM A LIQUID PHASE

[75] Inventor: Jochen Heinen, Haar, Fed. Rep. of Germany

[73] Assignee: Siemens Aktiengesellschaft, Berlin & Munich, Fed. Rep. of Germany

[21] Appl. No.: 298,594

[22] Filed: Sep. 2, 1981

[30] Foreign Application Priority Data

Sep. 29, 1980 [DE] Fed. Rep. of Germany ....... 3036643

[51] Int. Cl.³ .......................................... H01L 21/208
[52] U.S. Cl. .................................. 118/404; 118/412; 118/423; 156/622
[58] Field of Search ............... 118/404, 407, 411, 412, 118/415, 421, 423, 429; 156/622

[56] References Cited

U.S. PATENT DOCUMENTS

| Re. 28,140 | 8/1974 | Bergh et al. | 148/172 |
|---|---|---|---|
| 3,759,759 | 9/1973 | Solomon | 148/171 |
| 3,853,643 | 12/1974 | Verleur | 118/415 X |
| 3,990,392 | 11/1976 | Andre | 118/404 |
| 4,016,829 | 4/1977 | Ito et al. | 118/412 X |
| 4,149,914 | 4/1979 | Weyrich et al. | 148/171 |
| 4,214,550 | 7/1980 | Hawrylo | 118/412 X |

FOREIGN PATENT DOCUMENTS

| 2000096 | 9/1977 | Fed. Rep. of Germany. | |
| 115580 | 10/1975 | German Democratic Rep. | |
| 2439477 | 5/1980 | France. | |
| 51-28582 | 3/1976 | Japan | 156/622 |
| 2035686 | 6/1980 | United Kingdom. | |

OTHER PUBLICATIONS

L. R. Dawson, "High-Efficiency Graded-Band-Gap $Ga_{1-x}Al_xAs$ Light Emitting Diodes", *Journal of Applied Physics*, vol. 48, No. 6, Jun. 1977, pp. 2485-2492.

Zhilenis et al., "Cassette for Batch Growth of Layers by the Liquid-Epitaxy Method", *Instruments and Experimental Techniques*, vol. 19, No. 4, 1976, pp. 1221-1222.

Niina et al., "An Improved Liquid Phase Epitaxial Growth Method for Mass Production of GaP Green LED's", *IEEE Trans. on Electron Devices*, vol. ED-24, No. 7, Jul. 1977, pp. 946-950.

Primary Examiner—John D. Smith
Assistant Examiner—Bernard F. Plantz
Attorney, Agent, or Firm—Hill, Van Santen, Steadman, Chiara & Simpson

[57] ABSTRACT

A device for simultaneously producing a plurality of substrate disks each having a plurality of different layers by a liquid phase epitaxy as each substrate disk is moved sequentially through different melts contained in the liquid phase characterized by a first unit having tongues slidably received therein and a plurality of chambers spaced along the direction of sliding of said tongues, a second unit having a crucible for each of said chambers being disposed for relatively movement on the first unit from a position with the crucible out of communication with the chamber to a position in communication for transferring the melt from the crucible to the chamber and each of the said tongues having aligned recesses for receiving the substrate disk so that a row of substrate disks can be passed from one chamber to the next following chamber so that the disks in each row receive epitaxial layers sequentially.

13 Claims, 8 Drawing Figures

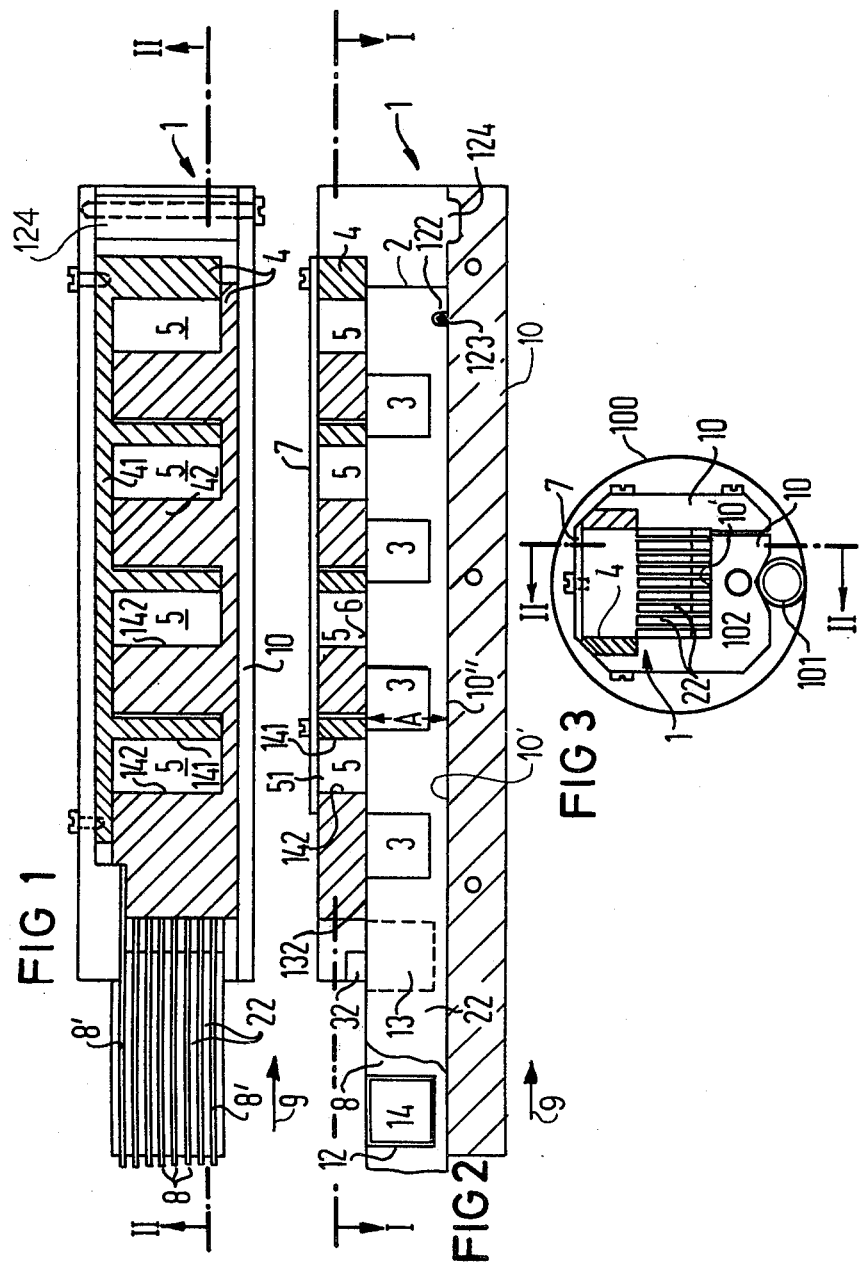

4,406,245

DEVICE FOR EPITAXIAL DEPOSITING LAYERS FROM A LIQUID PHASE

BACKGROUND OF THE INVENTION

The present invention is directed to a device for epitaxially depositing from a liquid phase a plurality of semiconductor layers simultaneously on several substrate disks which device has a plurality of melting crucibles, which are provided for homogenization of the initial melts, several plates which are arranged parallel to one another with recesses for receiving the substrate disks to be coated and chambers which are provided for receiving portions of the melts so that each disk is provided with contact with different melts sequentially as the disk is moved through the device.

A device for the epitaxially depositing of semiconductor layer from a liquid phase simultaneously on several substrate disks which device has individual melting crucibles for homogenization of each of the individual melts, several plates which are placed in parallel with recesses for receiving the substrate to be coated with the layers and an arrangement for creating portions of each of the melts is utilized by Bell Laboratories. In this device, the parallel plates, which are inserted through the crucibles, are shiftable tongues which have a bore. If the bore holes are located in the melting crucible, they will be filled with a quantity of the melt corresponding to the volume of the bore hole which is designated as a proportional chamber or aliquot. The tongue is then shifted so that the bore hole is pushed out of the melted crucible and proceeds over a substrate disk which is held for coating. From the melt contained in the bore hole, which is now located over the substrate disk, accordingly to the principles of the liquid phase epitaxy, a semiconductor layer will be deposited on the surface of the substrate disk. By means of an arrangement of a plurality of these plates or tongues provided with bore holes which can be in communication with melting crucibles, and by means of an arrangement of a corresponding plurality of substrate disks, the simultaneously shifting, etching and following depositing will enable a layer to be deposited from the melt on a corresponding plurality of disks with the shift of the substrate disk being unnecessary.

It is known from U.S. Pat. No. 4,149,914, to provide a plurality of substrate disks on which several epitaxial layers are sequentially and successively applied. This device consists of a plurality of melting crucibles and a shiftable tongue with a plurality of recesses for receiving or supporting the substrate disks with the number of recesses corresponding to the numbers of substrate disks. When also several layers are simultaneously deposited on several substrate disks, the deposition of the $n^{th}$ layer takes plate on the $m^{th}$ substrate disk at a different point of time and thus under different temperature conditions than the $n^{th}$ layer on the $(m+m')^{th}$ substrate disk.

SUMMARY OF THE INVENTION

The present invention is directed to providing a new device for the execution of a liquid phase epitaxy of a plurality of epitaxial layers on a plurality of substrate disks sequential whereby all substrate disks have the specific layer deposited simultaneously and under the same conditions.

These problems are solved by a device for simultaneously producing a plurality of substrate disks each having a plurality of different semiconductor layers by epitaxially depositing each layer from a different liquid phase as each substrate is moved sequentially through different melts containing said liquid phases. The device comprises a first member or unit and a second member or unit, said second unit being disposed on said first unit for relatively sliding movement along one direction, said second unit having a number of crucibles for homogenizing each initial melt spaced thereon along said one direction, said first unit having a number of depositing chambers spaced thereon along the one direction of said relative sliding movement, said number of depositing chambers being equal to the number of crucibles and also being equal to at least the number of layers to be deposited on each substrate disk, said crucible and depositing chambers each being spaced apart a length at least as large as the maximum length of the individual crucibles and depositing chambers as measured along said one direction, said first and second units being moveable so that the crucibles containing the homogenized initial melts are moved from a position out of communication with the respective chambers to a position in communication with said chambers for depositing the melt in each individual crucible into its corresponding depositing chamber and said device including means for supporting a plurality of substrate disks in at least two spaced rows of at last two disks and extending transverse in the one direction, said means including at least two sliding tongues having recesses disposed on at least one surface and spaced along the length of said tongue, said second member having means for forming groups of aligned slots with each group slidably receiving one of said tongues for displacement in said slots in said one direction so that each row of recesses can be moved to present the substrates supported therein in contact with a melt in the depositing chambers to sequentially coat said substrates with each layer.

Preferably, the means for supporting utilizes a plurality of sliding tongues which are arranged to extend vertically with respect to a sliding surface between the first and second units and preferably parallel to a direction of gravity. Preferably, the outer two tongues have recesses only on the side facing towards the center of the group of tongues with the intermediate tongues having the recesses on both surfaces. Preferably, the recesses in each of the tongues have dimensions which correspond to the dimensions of the substrate disk and are slightly larger than the corresponding dimensions of each of the depositing chambers so that at least two edges of each recess such as the bottom edge and either the trailing or leading edge are located outside of the depositing chamber as the recess on the tongue slides therethrough.

Preferably the means for forming the slots comprises the first unit being formed by a plurality of individual plates, which are spaced apart to form the group of slots for receiving the sliding tongues and the plates have recesses which are aligned to form the depositing chambers which are broken up by the tongues moving therebetween. These aligned plates as well as the sliding tongues have upper surfaces which form the sliding surface on which the first unit and second unit slide.

The second unit is preferably formed of two relative moving parts which have intermeshing comb-like structures so that the size of each of the melting crucibles can be changed to improve the feeding of the initial melt from the crucible to its respective depositing chamber.

Preferably, the plates forming the means for providing slots and the tongue move together simultaneously as the first and second units are moved relative to each other to have the crucible communicate with the respective chambers. Continual relative movement of the unit causes the two parts of the comb-like structure forming the second unit to move relative to each other to squeeze the melt in the individual crucibles into their respective depositing chambers. Subsequent to the completion of the transfer of the melt from the crucible to the depositing chambers, the individual tongues are moved relative to the plates to move the various disks through the plurality of depositing chambers successively to sequentially deposit the layers on each of the disks.

For a number of semiconductor components as for example luminescent diodes, injections lasers, IMPATT diodes and solar concentrator cells, multilayer crystal structures are required and the individual layers are different in their compositions from one another. For reasons of the reproduceability however, the physical properties of these individual layers must coincide in the entire series of components being produced. This places a higher requirement on a rational mass production method whereby stroke for stroke one layer after the other is produced simultaneously on a plurality of substrate disks. Care must thus be taken that the melt provided for the individual layers of the substrate disk to be coated simultaneously is sufficiently homogenous and that no material is transported from one melt to the next following melt. With the inventive device, it is guaranteed that in each case, one layer of all substrate disks is deposited at an identical temperature reduction whereas in the device of the above mentioned U.S. Pat. No. 4,149,914 a different temperature would exist for said coating on all disks.

BRIEF DESCRIPTION OF THE DRAWINGS

FIG. 1 is a cross-sectional view of the device in accordance with the present invention taken along the lines I—I of FIG. 2;

FIG. 2 is a cross-sectional view with portions broken away of the device in accordance with the present invention taken along the lines II—II of FIG. 1;

FIG. 3 is an end view of the device of FIGS. 1 and 2;

DESCRIPTION OF THE PREFERRED EMBODIMENTS

Figure 4:
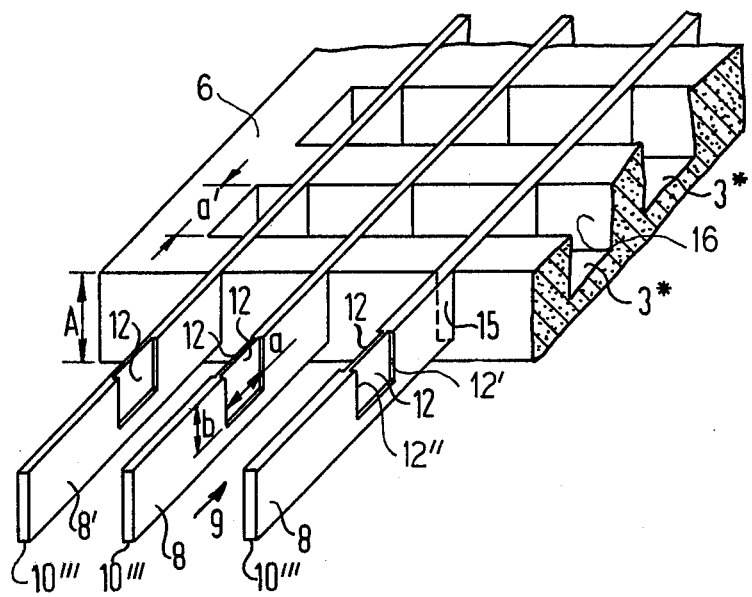
FIG. 4 is a prospective view of an embodiment of a portion of the device in accordance with the invention.

The principles of the present invention are particularly useful in a device for simultaneously producing a plurality of substrate disks having a plurality of different semiconductor layers by epitaxially depositing each layer from a different liquid phase as each substrate disk is moved sequentially through the different melts containing the liquid phases. The device is generally indicated at 1 in FIGS. 1, 2 and 3.

The device 1 has a housing 10 which is formed of a pair of members which are secured together by a threaded fastener to form a channel as illustrated in FIG. 3. On a base surface 10' of the channel, the housing 10 slidably receives a first member or unit 2 for sliding movement in a direction of arrow 9. The unit 2 has a plurality of depositing chambers 3 which are separated by partitions and are spaced along the unit in a direction 9. The unit 2 has an upper support surface 6 on which a second member or unit 4 is slidably received. The second unit 4 is composed of a pair of comb-like members 41 and 42 which are intermeshed together and provide a plurality of space melting crucibles 5 which are spaced along the direction 9 with substantially the same spacing as between the chambers 3. To close the tops of each of the crucibles 5, the unit 4 includes a cover 7 which is fastened thereon. Due to the mounting of the unit 2 for sliding on the surface 10', relative sliding movement between the units 2 and 4 will occur with the sliding being on the surface such as 6.

The unit 2 includes means which forms aligned groups of slots 15 in partitions 16 with each group receiving a sliding tongue 8 which slides relatively within the unit 2. Each of the sliding tongues 8 has a plurality of recesses 12 for supporting substrate disks such as 14 therein. The sliding tongues 8 have a length exceeding the length of the unit 2 and project from one end of the device or the unit 2 a sufficient amount so that all of the substrate disks in the recesses 12 can pass through the unit 2 as the tongue is slid from its furthest left-hand position to it furthest right-hand position.

As mentioned hereinabove, the housing 10 as best illustrated in FIG. 3, preferably consists of two parts which are fastened together by fasteners such as screws and receives the unit 2 as well as the unit 4 which unit 4 has the cover 7. The housing 10 is considered as stationary and the part 2 with the sliding tongues 8 are shiftable both relative to each other and to the housing 10.

The device 1, as shown in FIGS. 1 and 2, is in an initial or starting state which exists before transfer or decanting of the melt from each of the melting crucible 5 into the appropriate depositing chambers 3. For decanting, the units 2 and 4 are shifted relatively in the direction of the arrow 9 so that a respective depositing chambers 3 are positioned at least under a portion of the crucibles 5. As illustrated in the construction of the device of FIGS. 1 and 2, this means that the unit 2 is shifted respectively to the housing 10 as well as the second part or unit 4. It is noted that a portion of the unit 4 such as the comb 41 is secured to a side wall of the housing 10 by fasteners such as screws. While the device illustrates the unit 2 moving relative to the unit 4, it is also possible to construct the device so that the unit 4 will be shiftable and the unit 2 is held stationary. The spacing of the depositing chambers 3 from one another and the spacing of the melting crucibles 5 from one another are selected to be equal to each other and large enough so that when the units 4 and 2 are in the position illustrated in FIGS. 1 and 2, the depositing chambers 3 are not in communication with any one of the crucibles 5 and requires shifting by a predetermined amount before an overlapping of the crucible 5 with the chambers 3 will occur.

As mentioned hereinabove, the sliding tongues 8 have recesses 12 for receiving in each case the substrate disk such as the disk 14. If the matter requires a pre-substrate, each tongue will have one row of additional recesses 13 which is illustrated in broken lines in FIG. 2. For a better understanding of the inventive device 1, FIG. 4 shows a detailed description of an embodiment of the part 2' which has depositing chambers 3 and three sliding tongues 8', 8 and 8 which only illustrate the recesses 12 for the substrate disk which are to be coated with the layers in accordance with the present invention. As is apparent from the description, the recesses 12 are provided to lie opposite one another on both sides of the sliding tongues so that the two sliding tongues 8 and 8 have four recesses 12 in a row for receiving four substrate disks. The sliding tongue 8' only has recesses on one surface which is the surface facing the adjacent tongue 8. As illustrated, each of the tongues 8 and 8' stand vertically to the sliding or upper surface 6 so that the substrate disks inserted into the recesses 12 are shifted in the direction of arrow 9 and are directed through the depositing chambers 3 while in a vertical position. From the illustration of FIG. 4, it can also be recognized in the case of the common shifting of the sliding tongues 8 and 8' in the direction 9, the substrate disks located in the recesses 12 on a row of disks will proceed from a depositing chamber 3 to the next following chamber. The recesses 12 and the substrate disk are dimensioned so that with respect to one another, the substrate disk, which are not illustrated in FIG. 4, completely fill up the recess 12 in each case and no significant, unnecessary and interfering interspace occurs between the edges of the substrate disk and the edges of the recess and the free surfaces of the substrate disk forms a plane as precisely as possible with the side surfaces of the sliding tongue 8 in each case. In this manner, it is guaranteed that the sliding tongue 8 can be pushed through the aligned slots 15 in the partitions 16 in a sliding manner so that with each of the recesses 12 filled with a substrate disk and a movement of the tongue 8 from one chamber 3 to the next following chamber, a sufficient seal is present to prevent the material of the first chamber from being transported into the second depositing chamber. In addition no portion of the material at all is transported along from one depositing chamber 3 into the following depositing chamber by being carried in any interspaces between the substrate disk and the recess 12.

So that the substrate disk stand vertically in the recesses 12 and do not fall out of these recesses during the passage of the tongue in the direction 9 through the unit 2 and the depositing chambers 3, the dimensions of the recesses 12 and the tongue 8 have the length a and width b which are larger than the corresponding length a' and width b' of the depositing chamber 3. The difference in the dimensions is sufficient that the lower edge of the substrate inserted in each recess 12 is constantly positioned below the bottom surface or floor 3* of the depositing chamber 3 and with the pushing in the direction 9 either the front edge 12' or a back edge 12" is always positioned in the massive portion of the partitions 16 of the unit 2 which is outside of the depositing chamber 3. Thus, the substrate disk located in the specific recess 12 is continually held securely in the recess.

By arrangement of the substrate disk on both sides of the sliding tongue 8, twice as many substrate disks per sliding tongue can be simultaneously processed. In addition to this economical advantage, a still further technological advantage is presented by this double arrangement of the substrate disks. When the two sliding tongues 8 in FIG. 4 are shifted in the direction 9 so that their recesses 12 are already located in the deposition chamber 3, an epitaxial deposition proceeds from the portion of the melt which is located in the portion of the depositing chamber 3 between the sliding tongues 8 and 8 towards both sides of the tongues where substrate disks are located in the recesses 12. As is more apparent in FIG. 1 than the schematic depiction of FIG. 4, the spacing between neighboring sliding tongues 8 is very small with respect to the length of the dimensions a' and b'. Thus the total surface of this volume portion of the depositing chamber 3, which is filled with a melt and extends between neighboring adjacent sliding tongues 8 is essentially composed of the surfaces of the two substrate disks which stand opposite from one another with respect to this volume portion. This contributes quite significantly to a homogenousness of the deposit on the substrate disk and in particular, specifically contributes an epitaxy without significant intensified edge epitaxial growth as has been known and feared for years in sliding process for epitaxial depositer. In the case of a plurality of sliding tongues as shown in FIG. 1, the significant advantage can be obtained for the substrate disk of all sliding tongues if the two specific outer sliding tongues 8' are free of recesses on their outer surfaces as illustrated in FIG. 4. Thus, the tongues 8' will only have one recess per location for receiving a single disk. Then, no depositing takes place from the two volume portions of any depositing chamber 3 which are located between the specific outer sliding disk 8' and the outer wall of the depositing chamber 3 which extends parallel to the sliding tongue 8'.

A preferred embodiment of the structure for the device 1 which is particularly simple and economical to produce is shown and illustrated in FIGS. 1-3. In this particular device, the first unit 2, which has the depositing chambers 3, consists of a number of individual plates 22 which are put together in an alternating sequence with the sliding tongues 8 and 8' as illustrated in FIG. 3. The profile of the plate 22, which is disposed for example between a pair of the sliding tongues 8, is best shown by the side view of FIG. 5. The plate 22 has four notches or recesses 33, which form the four depositing chambers 3 and extend along the direction of the arrow 9. The first recess 33' forms a first depositing chamber and is spaced by a portion 34 from a second recess 33" that forms the next depositing chamber. Since the two parts of the housing 10, which are apparent from FIG. 3, can form the above-mentioned outer wall of the depositing chambers 3, all the plates 22, which form the unit 2, are advantageously identically shaped parts and the plates 22 are aligned to form the chamber 3 which are spaced in a direction extending parallel to the sliding tongues 8 and are separated by partitions or walls formed by the portion 34. The plates 22 have a lower edge surface 10" while the tongues have a lower edge 10'". These edges 10" and 10'" are aligned in a plane when the plates 22 and the tongues 8 are assembled together and rest on the bottom surface 10' of the housing 10. Thus the distance A between a top surface and the bottom surface 10" of the plate 22 corresponds to the height A of the element 2' in FIG. 4.

Figure 5:
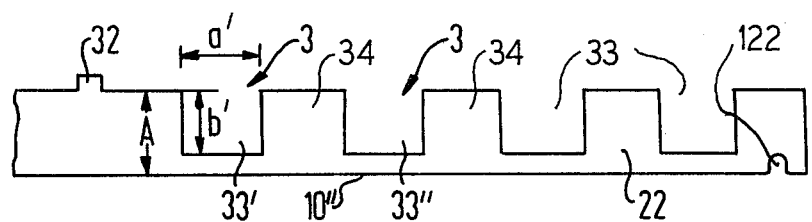
FIG. 5 is a plan view of an individual plate utilized in the embodiment illustrated in FIGS. 1, 2 and 3.

As illustrated, each of the individual plate 22 have a recess 122 for receiving an arresting pin 123. Additionally, the sliding tongues 8 and 8' each have a recess similar to the recess 122 which is best illustrated in FIG. 5. The pin 123 (FIG. 2) not only keeps the plates 22 together but also prevents relative sliding movement between the plates 22 and the tongues 8 and 8' as the unit 2 formed by the tongues and the plates 22 is moved in the housing 10.

As best illustrated in FIGS. 1 and 2, the device 1 operates in the following manner. Prior to transferring the individual melts in the melting crucibles 5 of the second unit 2 into the depositing chambers 3, the plates 22 of the unit 2 as well as the sliding tongues 8 and 8' are in a position such as illustrated in FIGS. 1 and 2. The sliding tongue 8 and 8' divides the individual depositing chamber 3 into a plurality of partial volumes which are positioned between adjacent tongues such as 8'. These partial volumes are also designated as aliquots because in the case of the melt filled into the melting chambers, these partial volumes are those individual portions of the melt from which the then later individual epitaxial layer is deposited on the substrate disk. In the case of the embodiment illustrated in the FIGS., two substrate disks located in the recesses 12 are coated from each single aliquot. In the case of the special embodiment formed in part 2 described above which is formed of plates 22 these are combined together with the sliding tongues 8 and 8' into a set and the melting chambers 3 are already divided into partial volumes that are equal as previously mentioned. Each of the melting chambers or crucibles 5 will have its particular melt disposed therein; however, for the purposes of illustration, only the first crucible is illustrated as containing a melt 51 which is illustrated by a miniscus which is illustrated in broken lines. With the shifting of the unit 2 in the direction of arrow 9, the unit will move until lugs or stops 32 on the plates 22 (best illustrated in FIGS. 2 and 5) come to rest on a stationary abutment surface 132 of a part 42 of the unit 4. At this point in time the chambers 3 and the melting crucibles 5 are already over one another to such an extent as indicated in 6a to allow communication of the contents such as the melt 51 from the crucible 5 into its respective chamber 3. As illustrated in this particular state, the melt 51 can proceed into the individual partial volumes of the depositing chambers 3. Since the melt is very viscous the general gravitational force is not sufficient to obtain a reliable and uniform filling of each of the partial volumes of the depositing chambers 3 and the application of additional pressure is therefore necessary. In the illustrated embodiment, this pressing-out will proceed to force the individual melts located in the melting crucibles 5 into the specific associated depositing chambers 3 and occurs in each of the four crucibles simultaneously so that the transfer is a simultaneous transfer. As illustrated and as mentioned hereinabove, the unit 4 is composes of two comb-shaped parts 41 and 42 which are meshed with one another. The crucibles are formed between the surface 141 and 142 of the meshed teeth of the parts 41 and 42. By means of shifting the parts 41 and 42 with respect to one another to reduce the distance between the surface 141 and 142, the size of each of the crucibles 5 can be reduced.

Figure 6A:
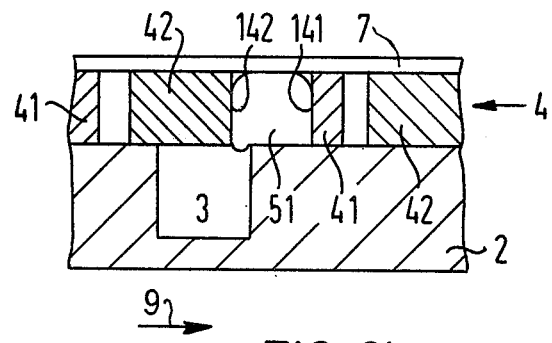
FIGS. 6a, 6b and 6c are partial cross-sectional views similar to FIG. 1 showing stages in the operation of the device with FIG. 6a showing the beginning of the transfer of the melt from a crucible to the respective depositing chamber, FIG. 6b showing an intermediate condition with a substantial amount of the melt being transferred, and FIG. 6c showing the completion of the transfer of the melt from the crucible to the depositing chamber.
Figure 6B:
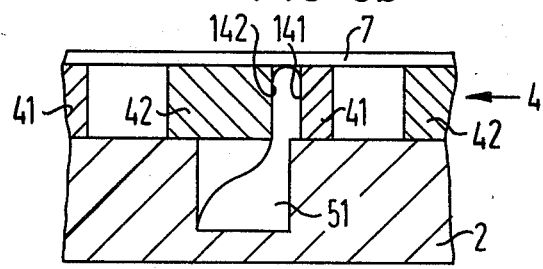

In the illustrated embodiment the displacement of parts 41 and 42 of the unit 4 with respect to one another occurs because the part 41 is rigidly mounted on the housing 10 and the part 42 on the other hand just like the unit 2 is displaceable with respect to the housing 10. Displacement is obtained in the case of the present embodiment in a simple manner in that the abutment surface 132 is provided on the part 42. Thus, when the unit 2 has the lugs 32 of the plates 22 engaged on the abutment surface 132 and the continued movement of the sliding tongues in the direction 9 due to the arresting force created by the pin 123, which is received in the grooves or notches 122, causes the unit 2 to be continually moved in the direction of the arrow 9. This will result in displacement of the part 42, which, as best illustrated in FIG. 6b, moves an inner wall or surface 142 of the crucible 5 towards the wall 141 to decrease the volume of the crucible. This decreasing of the spacing between the surfaces 142 and 141 decreases the volume of the crucible and presses the melt out of the crucible and into the individual depositing chambers 3. Such a response or flow of the material is illustrated in FIG. 6b. Precautions should be taken for example by providing a narrow channel so that any gas contained in each of the depositing chambers 3 can escape as the melt is pressed into the chambers or aliquots of the melt.

Figure 6C:
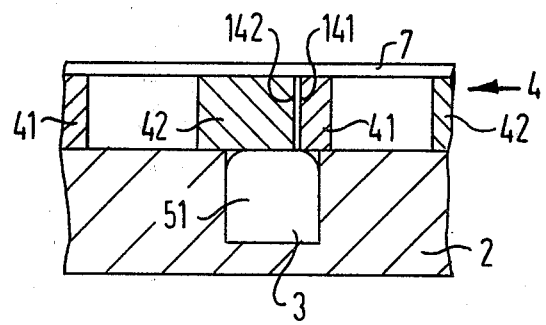

Finally, as best illustrated in FIG. 6c, the parts 42 is moved relative to the part 41 so that the surface 142 lies on the surface 141. Thus, the total amount of the melt in each crucible 5 is now located in the specific associated depositing chambers 3. Since each of the melts 51, while it was located in the melting crucible, had already experienced a complete homogenization, the equal portions of the melts which are located in each aligned or individual partial chamber between the sliding tongues 8 and 8', are correspondingly homogenous with respect to one another. The later depositing of the melts on the substrates then takes place from aliquotes which are identical to one another.

When the shifting state or position of the unit 2 corresponds to that illustrated in FIG. 6c, each of the individual depositing chambers 3 are filled with the melt and the arresting pin 123 in the recesses 122 of the plates 22 and slides 8 will be over a groove 124 in the surface 10' of the housing so that the pin 123 can drop out of the recess to disengage the sliding tongues 8 and 8' from the parts 22 which form the unit 2. Further displacement of the sliding tongues 8 and 8' in the direction of arrow will permit the substrate disks located in all of the recesses 12 of each sliding tongue 8 and 8' to be moved progressively one row after another into the first depositing chamber 3. If a beginning or a further recess 13 is provided for a pre-substrate, then the row of presubstrate in the recess 13 will proceed into the first depositing chamber. This pre-substrate then serves the purpose of eliminating any over saturation which may be present in the aliquotes by means of depositing on these pre-substrates recesses. The actual depositing will then proceed after the above described presubstrate has been moved out of the first depositing chambers and the first row of substrate disks 14 in the recesses 12 are inserted into the first chamber.

The rows of substrate disks is the recesses 12 of the sliding tongues 8 and 8' are pushed in succession from one depositing chamber into the next following chamber as the tongues are shifted in the direction of the arrow 9 and each of the substrates is then coated with an additional epitaxial layer in each chamber. After pushing the substrate disk of the recess 12 through all four depositing chambers 3, these substrate disks will have the desired four expitaxial layers lying one over the other. The substrate disks are then removed from the device.

As illustrated in FIGS. 1, 2 and 3, the device 1 is positioned relative to the gravitational force so that the melting crucibles 5 are above the depositing chambers 3 and the substate disks are located in the recesses 12 in a vertical position in the depositing chambers 3. In general, this is the most advantageous operating position for the device 1 in accordance to the present invention. For the operation, the device 1 as indicated in FIG. 3, is arranged in a quartz tube 100 which is located in a corresponding kiln. A feed pipe 101 for hydrogen extends into the interior of the tube 100 and the housing 10 may have an opening or face for receiving a sensing device 102 such as a thermocouple.

In particular and in the case of a sliding tongue having recesses is only one side surface such as the sliding tongues 8', the inventive arrangement can also be utilized by placing it in a position which is rotated approximately 90° from that illustrated in FIG. 3. Thus the sliding tongues lie in horizontal planes and the recesses are located in the upper surface of each tongue.

Although various minor modifications may be suggested by those versed in the art, it should be understood that I wish to embody within the scope of the patent granted hereon, all such modifications as reasonably and properly come within the scope of my contribution to the art.

I claim:

1. A device for simultaneously producing a plurality of substrate disks each having a plurality of different semiconductor layers by epitaxially depositing each layer from a different liquid phase as each substrate disk is moved sequentially through different melts containing said liquid phases, said device comprising a housing, a first unit and a second unit, said second unit being disposed on a surface of the first unit for relative sliding movement therebetween along one direction, said first unit containing a number of depositing chambers spaced along the one direction of said relative sliding movement, said second unit having a number of melting crucibles for homogenizing each initial melt spaced along said one direction, said number of depositing chambers being equal to the number of crucibles and also being equal to at least a number of layers to be deposited on each substrate disk, said crucibles and depositing chambers each being spaced apart a length at least as large as the maximum length of the individual crucibles and the depositing chambers as measured along said one direction, said first and second units being moveable so that the crucibles containing the homogenized initial melt move from a position out of communication with the chambers to a position in communication with their respective chambers for transferring the melt from the individual crucibles into the corresponding depositing chambers, said device including means for supporting a plurality of substrate disks with at least two rows of disks of at least two disks which rows extend transverse to the one direction, said means including at least two sliding tongues having recesses disposed on at least one surface and spaced along the length of the tongues, said first unit having means forming a group of aligned slots for each tongue, each of said tongues being slidably received in a group of aligned slots for movement in said one direction so that each row of recesses can be moved to present the substrate disks supported therein in contact with melts in the depositing chambers to sequentially coat said substrate disks with each layer.

2. A device according to claim 1, wherein a number of the sliding tongues have recesses on opposite surfaces for receiving said substrate disks so that some of said tongues supports two disks for each row.

3. A device according to claim 1, wherein the sliding tongues are arranged in slots of the first unit in such a manner that the substrate disks are located in their recesses to be essentially vertical with respect to a sliding surface between the first and second units, said recesses to be pushed through the individual depositing chambers while in said position, wherein each of the recesses has a length and width which is substantially the same as the length and width of the substrate which is to be received therein, said length and width of the recesses being larger than the length and width of each depositing chamber so that at least one vertical edge and one horizontal edge of each recess are positioned outside of the depositing chamber as the recess is moved through the depositing chamber by the sliding of the tongue relative to the first unit.

4. A device according to claim 2, wherein the vertical direction is parallel to the direction of the gravitational force.

5. A device according to claim 1, wherein the sliding tongues comprise at least two sliding tongues having recesses only on one surface, said tongues being arranged as the outmost tongue with the recess facing each other, and all of the sliding tongues disposed between the outmost tongues each having recesses on both surfaces.

6. A device according to claim 1, wherein the first unit comprises a plurality of longitudinally extending individual plates having notches defining the depositing chamber, wherein said means for forming a group of aligned slots for receiving each sliding tongue being a spacing between adjacent plates.

7. A device according to claim 6, wherein the plates are alternately arranged with the sliding tongues to form a set which is inserted into the housing, the upper surface of said plates coacting with the upper surface of the sliding tongues to form the sliding surface between the second and first units.

8. A device according to claim 7, wherein the second unit has means for pressing out the individual melts from each of the individual melting crucibles into the depositing chambers.

9. A device according to claim 8, wherein the means for pressing out the second unit being formed of two comb-like parts arranged to mesh together with the gaps between the two parts forming the volume of the melting crucibles, means for displacing the two comb-like parts relative to one another to decrease the volume of each of said crucibles.

10. A device according to claim 9, wherein the means for displacing the two comb-like parts relative to each other comprises stop lugs being provided on the parts forming the first unit engaging an abutment surface on one of the comb-like parts so as to move said one comb-like parts with said plates of the first unit, the other of said comb-like parts being rigidly mounted on said housing so that as the sliding tongues and plates of the first unit move relative to position the depositing chamber in communication with the crucibles, said lugs engage the one comb-like part to move it relative to the other comb-like part to decrease the volume of each of the crucibles to press the melt from the crucible into the depositing chambers.

11. A device according to claim 10, wherein the first unit has means for releasably connecting the sliding tongues and the plates of the first unit together, said releasable means disengaging said sliding tongues from said plates of the first unit after a specific amount of displacement of the tongues and plates.

12. A device according to claim 11, wherein the means for releasably connection comprises each of the sliding tongues and the plates of the first unit having a recess receiving a pin, and said housing having a recess for receiving said pin from the recesses in the tongues and plates when the plates and tongues have been displaced to be aligned therewith.

13. A device according to claim 1, wherein each of the sliding tongues has a row of additional recesses between the first row of recesses and the first depositing chambers for receiving pre-substrates which are passed through the depositing chambers in sequence prior to passing the first mentioned row of substrate disks therethrough.

* * * * *